United States Patent
Guo

(10) Patent No.: US 7,627,027 B2
(45) Date of Patent: Dec. 1, 2009

(54) METHOD FOR MEASURING LOCKING TIME AND FREQUENCY ERROR IN RF RECEIVER

(76) Inventor: Wei Guo, Room 402 No. 4, Sub Lane 2 Lane 335, Weifang Road Shanghai, Shanghai (CN)

( * ) Notice: Subject to any disclaimer, the term of this patent is extended or adjusted under 35 U.S.C. 154(b) by 800 days.

(21) Appl. No.: 11/235,948

(22) Filed: Sep. 27, 2005

(65) Prior Publication Data

US 2006/0126710 A1    Jun. 15, 2006

(30) Foreign Application Priority Data

Dec. 10, 2004   (CN) .................. 2004 1 0089403

(51) Int. Cl.
    *H04B 3/46* (2006.01)
(52) U.S. Cl. .................................................... 375/224
(58) Field of Classification Search ................ 375/224, 375/225, 226, 227, 228; 714/30, 36, 715, 714/734, 738; 702/120, 121; 700/39, 81; 379/21, 26.02, 27.04; 370/247, 251; 324/513, 324/523, 527, 528, 750, 755, 763, 765; 73/465; 455/148

See application file for complete search history.

(56) References Cited

U.S. PATENT DOCUMENTS

| 5,524,281 A * | 6/1996 | Bradley et al. ........... 455/67.15 |
| 7,271,575 B2 * | 9/2007 | Pickerd et al. ........... 324/76.19 |
| 2003/0163267 A1 * | 8/2003 | Premy .......................... 702/72 |
| 2005/0047536 A1 * | 3/2005 | Wu et al. ...................... 375/346 |

* cited by examiner

*Primary Examiner*—Sam K Ahn

(57) ABSTRACT

A method is provided for measuring the locking time of an RF receiver. The method comprises inputting to the RF receiver an input sine wave with a certain frequency difference relative to the system operation frequency. An oscilloscope is used to capture the analog I and Q output signal of the receiver. The locking time is determined from the waveform imaged on the screen of the oscilloscope. Using the method allows measuring locking time accurately and in a short amount of time.

5 Claims, 2 Drawing Sheets

US 7,627,027 B2

METHOD FOR MEASURING LOCKING TIME AND FREQUENCY ERROR IN RF RECEIVER

CROSS-REFERENCE TO RELATED APPLICATION

This application claims priority to Chinese Patent Application No. 200410089403.4 filed Dec. 10, 2004.

FIELD OF THE INVENTION

The present invention relates to radio frequency (RF) receivers, and more specifically, to a method for measuring the locking time and locked frequency error of an RF receiver in a wireless communication system.

BACKGROUND

The structure of a conventional RF receiver used in a wireless communication system is illustrated in FIG. 1. As seen in the Figure, a received signal is input and transformed to I and Q (in-phase and quadrature) components in the receiver.

An important part of the receiver is the phase lock loop (PLL). The PLL is basically a closed loop frequency control system for purposes of synchronizing the phases of the two I and Q components together, thus determining the operational frequency of the receiver. The PLL function is based on the phase difference between the input and reference signals of a phase frequency detector (PFD). The PLL "locks" onto the phase of the reference signal so that the output signal of a voltage controlled oscillator (VCO) has a predefined phase relationship (for example, a zero, ninety or one hundred eighty degree relationship) with respect to the reference signal.

In general, it is desirable that the time for capturing the lock is as short as possible. Given that the PLL locking time is an important parameter in applications such as cellular radios where PLL locking times are critical, it is important that PLL locking times be verified. Thus, it would be beneficial in the art if a method were available that would allow for the easy measuring of PLL locking time accurately.

The receiver locking time is typically measured using automatic test equipment (ATE), such as an oscilloscope, to capture and image the control voltage of the PLL. The control voltage is output from an outside loop filter and then fed to the PLL to control the operation of the PLL. This prior art technique inherently suffers from a lack of indicating the phase of the control voltage (an oscilloscope generally only indicates amplitude), which reduces the overall accuracy of the resulting measurement.

SUMMARY OF THE INVENTION

The object of the invention is to provide a PLL locking time and locked frequency error measurement method capable of making the measurement in an accurate and efficient manner.

In particular, the present invention comprises of the steps of:

a) providing the RF receiver a sine wave with a preset frequency difference relative to the system operation frequency;

b) using an oscilloscope to image the analog I and Q output signal of the receiver; and c) determining the lock time from the waveform indicated on the screen of the oscilloscope.

Furthermore, the RF receiver locked frequency error measurement method in the present invention comprises:

(a) feeding the RF receiver system a sine wave with certain frequency difference relative to the system operation frequency;

(b) use the oscilloscope to image the analog I and Q output signal of the receiver; and (c) comparing the waveform portrayed on the screen of the oscilloscope to the standard sine waveform to get the frequency error.

One advantage of the method described above for determining the PLL locking time and the locked frequency error is that it allows for very good accuracy to be achieved.

Another advantage of the present invention is that no special instrument is required Only an oscilloscope is required to capture the I and Q output signal, so the test equipment is kept to a minimum, thus reducing the testing cost.

Another advantage of the present invention is that the locking time and locked frequency error can be generated efficiently from the waveform portrayed on the oscilloscope, allowing for getting the needed information in a short amount of time.

DETAILED DESCRIPTION OF THE PREFERRED EMBODIMENT

Figure 1:
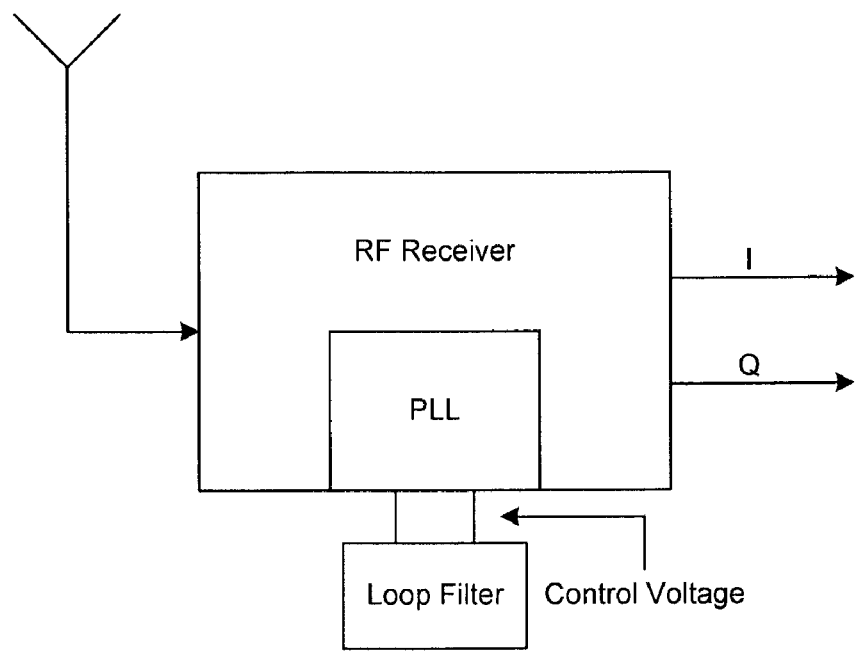
FIG. 1 illustrates a simplified structure of a typical RF receiver.

While the specification concludes with claims defining the features of the invention that are regarded as novel, it is believed that the invention will be better understood from a consideration of the following description in conjunction with the drawing figures.

The method presented here comprises first inputting to the RF receiver a sine wave with certain frequency difference relative to the receiver operation frequency. Next, an oscilloscope is used to capture the output signal of the receiver. Lastly, the locking time is determined from the waveform indicated on the screen of the oscilloscope.

In one preferred embodiment, the receiver system's operational frequency is 2 GHz. In one embodiment, a sine wave of 2 GHz+100 kHz is input to the receiver. A sine wave of 100 kHz should be indicated on the oscilloscope placed to capture the system output signal in the ideal condition; however, due to the time taken in the locking process, there exists a period of fluctuation of the waveform. The period represents the system locking time, which can be read from the screen directly.

Figure 2:
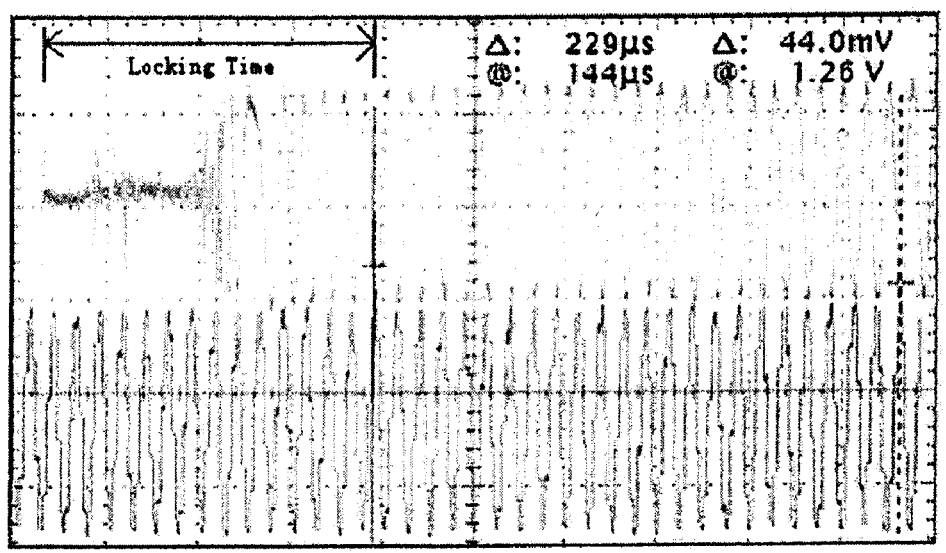
FIGS. 2 and 3 show a graph of a waveform for determining the locking time and frequency error in accordance with the invention.
Figure 3:
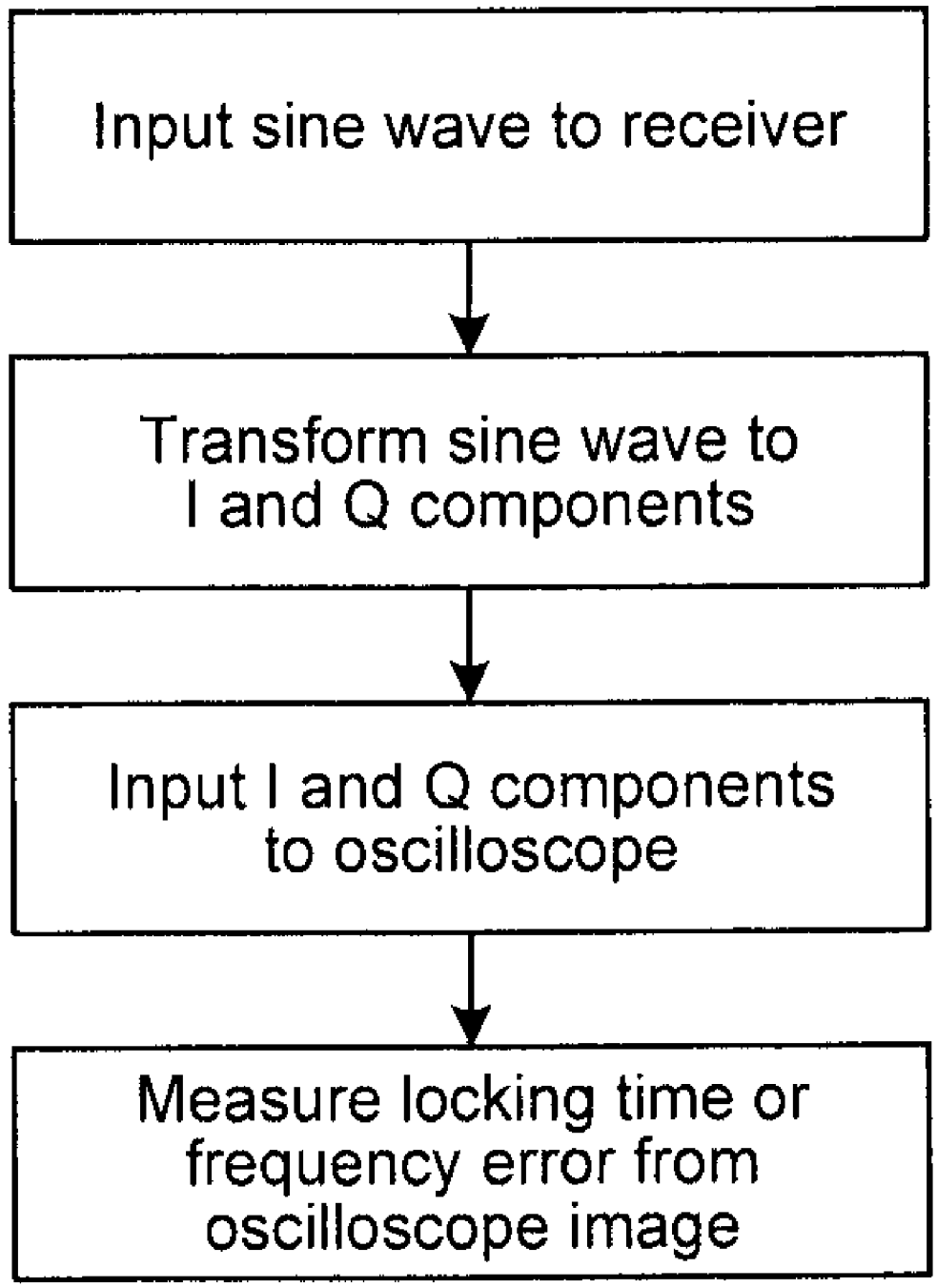

As shown in FIG. 2, in accordance with one embodiment of the invention, the captured waveform is then divided into two parts. The unstable wave in the front part is actually caused by the system locking process. As the receiver gradually settles into a lock status, a stable sine wave appears. Thus, the locking time is the period in which the unstable waveform remains. In FIG. 2, it is the portion before the vertical line.

The frequency error measurement method in accordance with the invention is implemented by first comparing the output waveform to the standard sine waveform input. This is shown in FIG. 2 under the receiver output waveform. To generate the locked frequency error, the waveform of a full cycle is measured for its cycle period, thus easily obtaining signal frequency. The difference between the output signal frequency (the upper graph of FIG. 2) and that of the standard input sine waveform is the desired locked frequency error.

In this preferred embodiment, it is determined that a standard input sine waveform of 100 kHz is used to derive the desired information. It is however appreciated that a sine waveform of 20 kHz, 50 kHz or 200 kHz may also be utilized according to the different wireless application and RF receiver chip requirements.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention

What is claimed is:

1. A method of measuring radio frequency (RF) receiver locking time, the method comprising:
    inputting to the RF receiver an input sine wave that has a predetermined frequency difference relative to a system operation frequency of the RF receiver;
    transforming in the RF receiver the input sine wave into in-phase (I) and quadrature (Q) components and outputting the I and Q components to an oscilloscope;
    using the oscilloscope to capture the I and Q output signal of the receiver and displaying the I and Q output signal onto a screen of the oscilloscope;
    determining a locking time from the waveform imaged on the screen of the oscilloscope as the interval between initial capture of the I and Q output signal by the oscilloscope and when a stable sine wave occurs.

2. The method of claim 1, wherein the locking time is determined from the imaged waveform and is the period in which an unstable portion waveform persists.

3. The method of claim 1, wherein the predetermined frequency difference of said input sine wave is selected from 100 kHz, 20 kHz, 50 kHz or 200 kHz.

4. A method of measuring locked frequency error of a radio frequency (RF) receiver, the method comprising:
    inputting to the RF receiver an input sine wave with a predetermined frequency difference relative to a system operation frequency of the RF receiver;
    transforming in the RF receiver the input sine wave into in-phase (I) and quadrature (Q) components and outputting the I and Q components to an oscilloscope;
    using an oscilloscope to capture an analog I and Q output signal of the receiver and displaying the I and Q output signal onto a screen of the oscilloscope;
    determining a frequency error from comparing the frequency of the output waveform imaged on the screen of the oscilloscope to that of the input sine wave.

5. The method of claim 4, wherein the comparing process is as follows:
    examining one cycle of the output waveform;
    deriving its frequency value of the output waveform;
    subtracting this frequency from the frequency of the input sine wave, with the difference between the frequency of the output waveform to the input sine wave being the frequency error.

* * * * *